United States Patent
Barsun

(10) Patent No.: US 7,859,847 B2
(45) Date of Patent: Dec. 28, 2010

(54) SPRING ADAPTED TO HOLD ELECTRONIC DEVICE IN A FRAME

(75) Inventor: Stephan Karl Barsun, Sacramento, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 820 days.

(21) Appl. No.: 11/027,337

(22) Filed: Dec. 29, 2004

(65) Prior Publication Data

US 2006/0139886 A1    Jun. 29, 2006

(51) Int. Cl.
*H05K 7/20* (2006.01)
*F28F 7/00* (2006.01)
*H01L 23/34* (2006.01)

(52) U.S. Cl. ............... 361/704; 165/80.2; 165/185; 257/718; 257/719; 361/710; 361/719

(58) Field of Classification Search ......... 257/718–719, 257/726–727
See application file for complete search history.

(56) References Cited

U.S. PATENT DOCUMENTS

| | | | | |
|---|---|---|---|---|
| 4,745,456 A | * | 5/1988 | Clemens | 257/717 |
| 5,424,918 A | * | 6/1995 | Felps et al. | 361/704 |
| 5,436,798 A | | 7/1995 | Wieland, Jr. | |
| 5,561,325 A | | 10/1996 | Ueno et al. | |
| 5,808,236 A | * | 9/1998 | Brezina et al. | 174/16.3 |
| 5,818,695 A | | 10/1998 | Olson et al. | |
| 5,926,372 A | * | 7/1999 | Rinehart et al. | 361/704 |
| 6,034,874 A | * | 3/2000 | Watanabe | 361/704 |
| 6,116,331 A | | 9/2000 | Tustaniwskyj et al. | |
| 6,179,047 B1 | | 1/2001 | Tustaniwskyj et al. | |
| 6,191,480 B1 | | 2/2001 | Kastberg et al. | |
| 6,196,299 B1 | | 3/2001 | Tustaniwskyj et al. | |
| 6,285,550 B1 | | 9/2001 | Belady | |
| 6,473,305 B1 | | 10/2002 | Gordon et al. | |
| 6,483,704 B2 | * | 11/2002 | Ulen et al. | 361/704 |
| 6,634,890 B2 | | 10/2003 | Peterson et al. | |
| 6,746,270 B2 | | 6/2004 | Peterson et al. | |
| 6,788,538 B1 | | 9/2004 | Gibbs et al. | |
| 6,888,072 B2 | | 5/2005 | Tsukamoto et al. | |
| 6,891,730 B2 | * | 5/2005 | Farassat | 361/769 |
| 6,916,122 B2 | * | 7/2005 | Branch et al. | 385/92 |
| 7,239,520 B2 | * | 7/2007 | Barsun | 361/719 |
| 2003/0161108 A1 | * | 8/2003 | Bright et al. | 361/707 |
| 2004/0109291 A1 | | 6/2004 | Kannmacher et al. | |
| 2006/0214284 A1 | * | 9/2006 | Haden et al. | 257/719 |

FOREIGN PATENT DOCUMENTS

JP    2001281295 A    10/2001
JP    200230564    10/2002

OTHER PUBLICATIONS

Translation of First Office Action in JP 2005369369 dated Nov. 18, 2008.
Translation of Second Office Action in JP 2005369369 dated Feb. 9, 2010.

* cited by examiner

*Primary Examiner*—Gregory D Thompson

(57) ABSTRACT

An assembly comprises a frame adapted to mount an electronic device having a thickness within a range of thicknesses. The frame is adapted to assemble to a heat sink assembly after the electronic device is mounted. The assembly further comprises at least one spring adapted to secure the electronic device to the frame.

26 Claims, 11 Drawing Sheets

SPRING ADAPTED TO HOLD ELECTRONIC DEVICE IN A FRAME

BACKGROUND OF THE INVENTION

Economic and competitive conditions create incentive for business organizations to improve operations to reduce costs, including inventory costs. Operations can be improved in fields of advancing technology by focusing design and development resources in areas that improve competitive advantage while leveraging costs of other product aspects across multiple products.

Cost leveraging and re-use enables aggregation of component demand across possibly many products leading to improved economies of scale, aggregate volume discounts, and reduction of supplier prices. Component leveraging also can reduce supply chain, handling, and inventory costs since component sorting, labeling, and tracking are reduced.

Component leveraging and re-use can reduce costs in other areas. For example, usage of a particular component in multiple products can avoid duplication of research and development costs. A reduction in the number of components can reduce the incidence of confusion and errors by inadvertently including an incompatible component in a product.

In a high-volume producer, inventory handling and tracking costs can be reduced by millions of dollars simply by aggregating components among multiple products.

Products can be designed to facilitate materials handling of particular systems and/or assemblies.

SUMMARY

In accordance with an embodiment of an electronic apparatus, an assembly comprises a frame adapted to mount an electronic device having a thickness within a range of thicknesses. The frame is adapted to assemble to a heat sink assembly after the electronic device is mounted. The assembly further comprises at least one spring adapted to secure the electronic device to the frame.

BRIEF DESCRIPTION OF THE DRAWINGS

Embodiments of the invention relating to both structure and method of operation, may best be understood by referring to the following description and accompanying drawings whereby.

DETAILED DESCRIPTION

An assembly includes a frame and a spring that attaches to the frame and is used to secure an electronic device, such as a processor, into the frame. A heat sink is supplied as a physically separate component and added to the spring-frame assembly after an electronic device module is secured to the frame. The illustrative structure enables selective materials handling. For example, the structure may be used to enable an inexpensive heat sink to be platform-specific, while an expensive processor module is leveraged or shared across product lines.

Figure 1A:
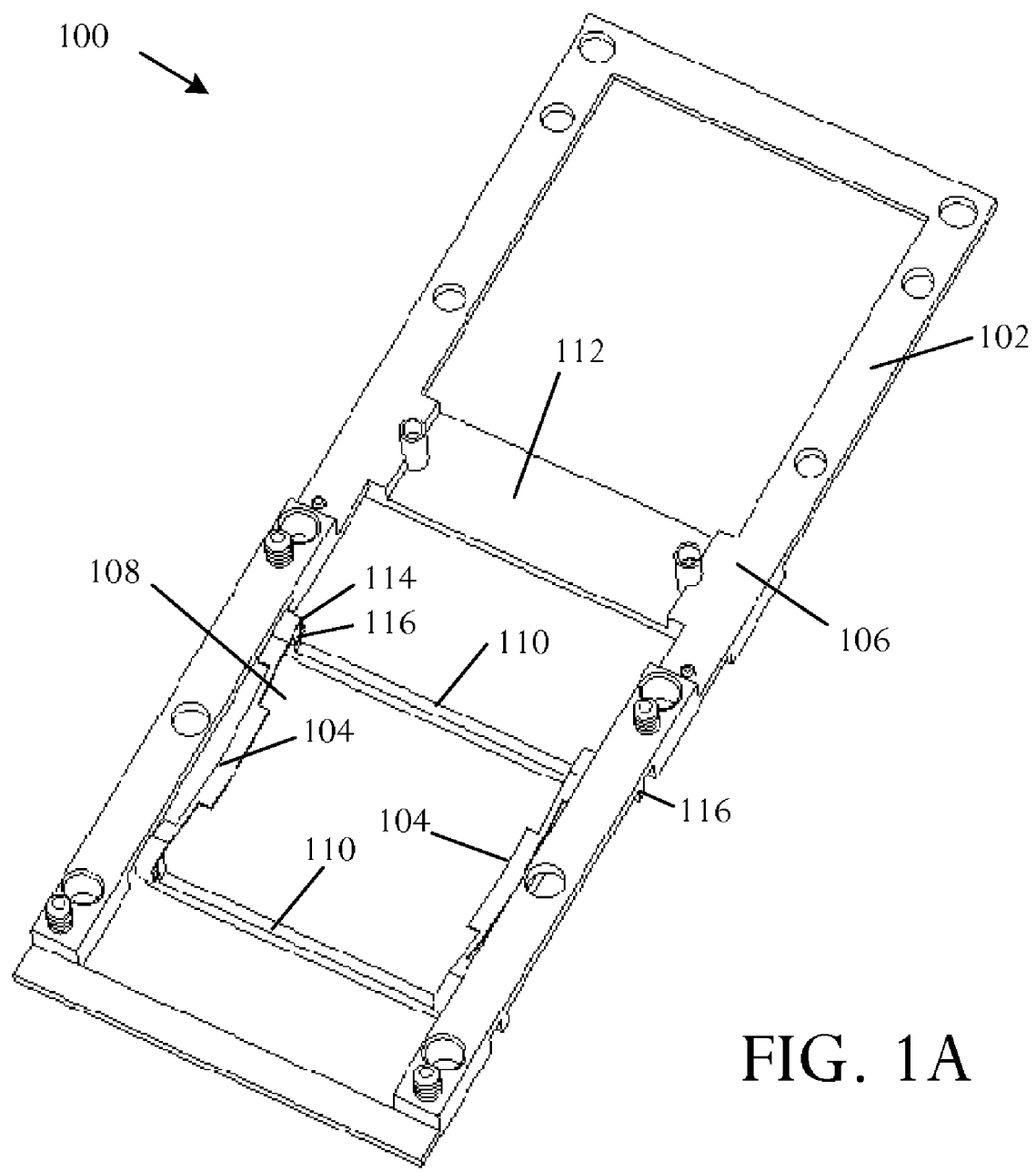
FIGS. 1A and 1B are perspective pictorial diagrams illustrating an embodiment of an assembly configured to support an electronic device and associated cooling infrastructure.
Figure 1B:
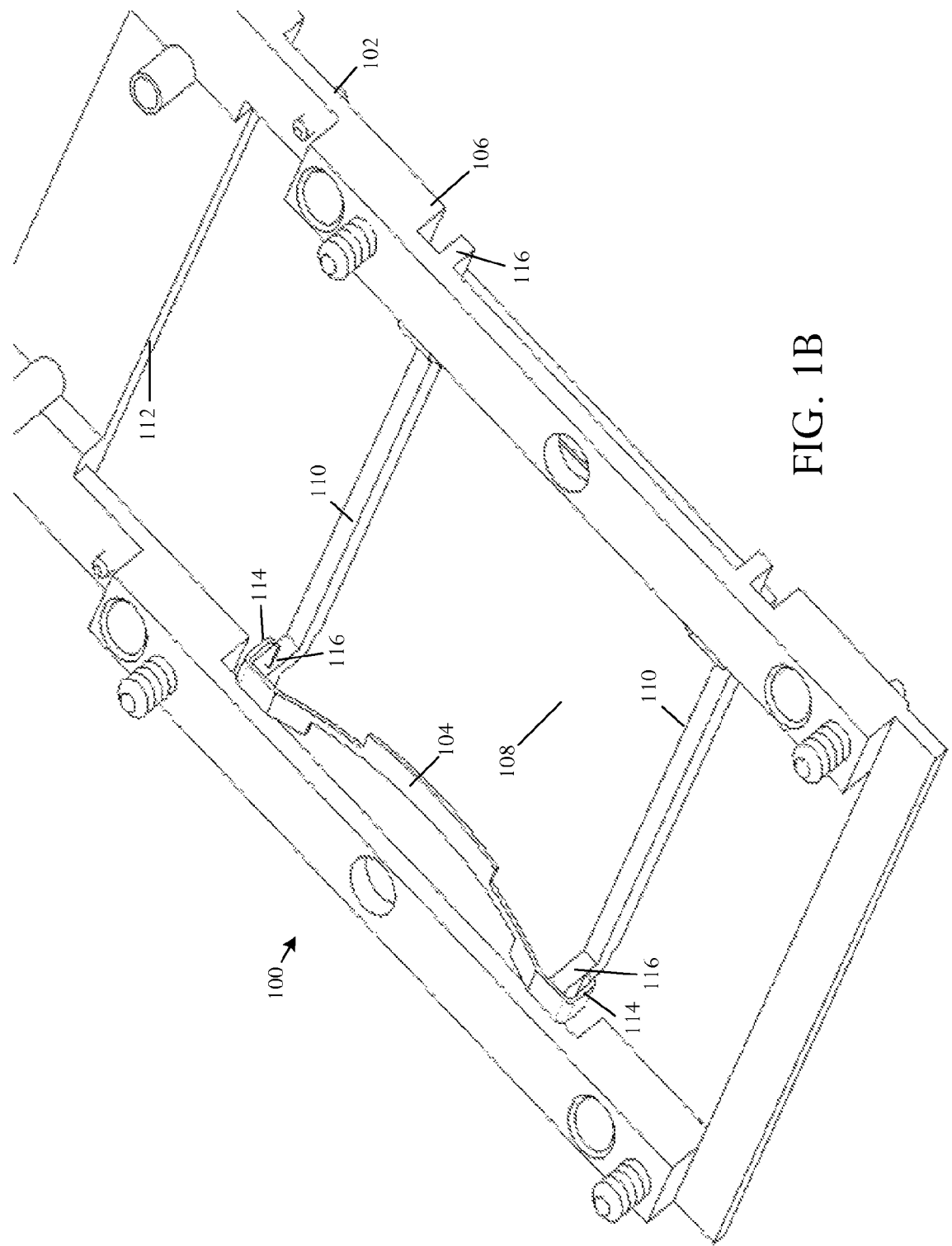

Referring to FIGS. 1A and 1B, two perspective pictorial diagrams illustrate an embodiment of an assembly 100 configured to support an electronic device and associated cooling infrastructure. The assembly 100 comprises a frame 102 adapted to mount an electronic device that may have a thickness within a range of thicknesses. The frame 102 is adapted to assemble to a heat sink assembly after the electronic device is mounted. The assembly 100 further comprises one or more springs 104 adapted to secure the electronic device to the frame 102.

The springs 104, for example leaf springs or other spring wire-forms, hold the electronic device, such as a processor, in place and supports facilitated handling. The capability to mount devices of varying thickness accommodates a tolerance range of device thickness, such as a range of processor board thickness. For example, a common range of variability in processor thickness may be ±10% to address differences in printed circuit board thickness. Usage of the leaf-spring eliminates motion that may otherwise result from loose seating inherent in other connection techniques, such as snap-fit techniques. In some embodiments, the range of variability handled by the leaf springs may be larger than ±10% and may be any appropriate range. For example, some leaf springs may have a size and properties that enable a wider range of thicknesses that address handling of different processor types. In some embodiments, the leaf springs may be configured to accommodate size variations inherent in mounting different generations of integrated circuit.

The frame 102 and one or more springs 104 may be configured to form a field replaceable unit 106 for stocking and supply, for example, according to a particular item or stock number. The field replaceable unit 106 is generally a hardware component which is capable of replacement in the field, rather than at the factory. The field replaceable unit may be replaced by a field engineer or other person, such as a customer or user. In various embodiments, the field replaceable unit 106 may be a hot-pluggable or hot-swappable assembly capable of replacement while power is connected to a system housing the assembly.

The field replaceable unit 106 is typically a mechanical assembly or circuit board capable of quick and simple removal and replacement by a user or technician without sending an entire system to a repair facility. A defective unit is generally discovered using common troubleshooting procedures, removed, and either shipped for repair or discarded with a replacement unit installed. Usage of the field replaceable unit 106 facilitates modular construction and may contribute to increased system availability and reliability.

FIG. 1A illustrates the entire frame 102. FIG. 1B shows a close-in view of a portion of the frame 102 and illustrates supports 110 for holding the electronic device, for example a processor card.

In the illustrative embodiment, the springs 104 are leaf springs and include tabs or catches 114 that engage rails 116 on the frame 102. The illustrative leaf springs 104 are flatform springs, typically constructed from a suitable metal although other materials may also be suitable for usage. In other embodiments, different structures can be used to engage the frame. Similarly, in other embodiments, different spring structures may be used, for example wire-bale or spring steel shapes. The springs 104 may be assembled by setting one end in a recess on the frame 102 and clipping the opposing end in place after the electronic device is positioned in the frame. The leaf springs 104 enable tool-free assembly of the electronic device to the frame 102.

A typical frame 102 may secure the electronic device using one or two leaf springs 104, although some embodiments may include more. The leaf springs 104 generally position to hook over one mating structure on the frame 102 and snap into place, holding an electronic device structure such as a processor board to the frame 102 without using screws or other separate hardware structures. A typical leaf spring secures the electronic device more rigidly than fasteners such as snaps, enables thickness variation of the held device.

The frame 102 may include features such as rails, pins, notches, and the like to assist centering of the electronic device during mounting. Generally, the features center the electronic device in an X-Y plane formed by a planar frame. The leaf springs 104 hold the device captive in the Z-plane perpendicular to the frame plane.

In the illustrative embodiment, a recess 108 is formed on the frame 102 and has a form and size adapted to receive the electronic device. In a typical embodiment, the electronic device may be a processor. Typically, the electronic device is a relatively high-power or high-wattage device in which suitable operation compels usage of a cooling component or device such as a heat sink.

In some arrangements, one or more electronic device side supports 110 may be formed on the frame 102 adjacent the recess 108. In the illustrative embodiment, electronic device side supports 110 are arranged substantially orthogonal to the leaf springs 104. The illustrative recess 108 has the form of a square or rectangle with the leaf springs 104 connected to two opposing sides of the recess and the electronic device side supports 110 formed on the two opposing sides of the recess 108 at right angles to the leaf springs 104.

The illustrative embodiment has a bolster plate 112 integrated to the frame 102. Integration of the bolster plate 112 into the frame 102 eliminates usage of a stand-alone bolster, thereby reducing cost and complexity, and increasing rigidity and durability. Frame supports coupling the frame to the bolster 112 can be constructed to reference the same side of the electronic device, for example the same side of a processor card, to facilitate electronic device connectivity despite possible variability in electronic device thickness.

In other embodiments, a bolster plate may be retained using a retention element such as a snap, clamp, latch or other suitable retention component. For example, a snap may be used to attach a plastic frame to a bolster constructed from a more rigid and durable material such as steel or other metal.

In a particular example, the frame may form a mezzanine structure with an integrated bolster plate on the frame underside in a single integrated piece. A heat sink which is not part of the integral frame structure can be fastened to the integral frame after an electronic device such as a processor is secured to the frame.

Figure 2A:
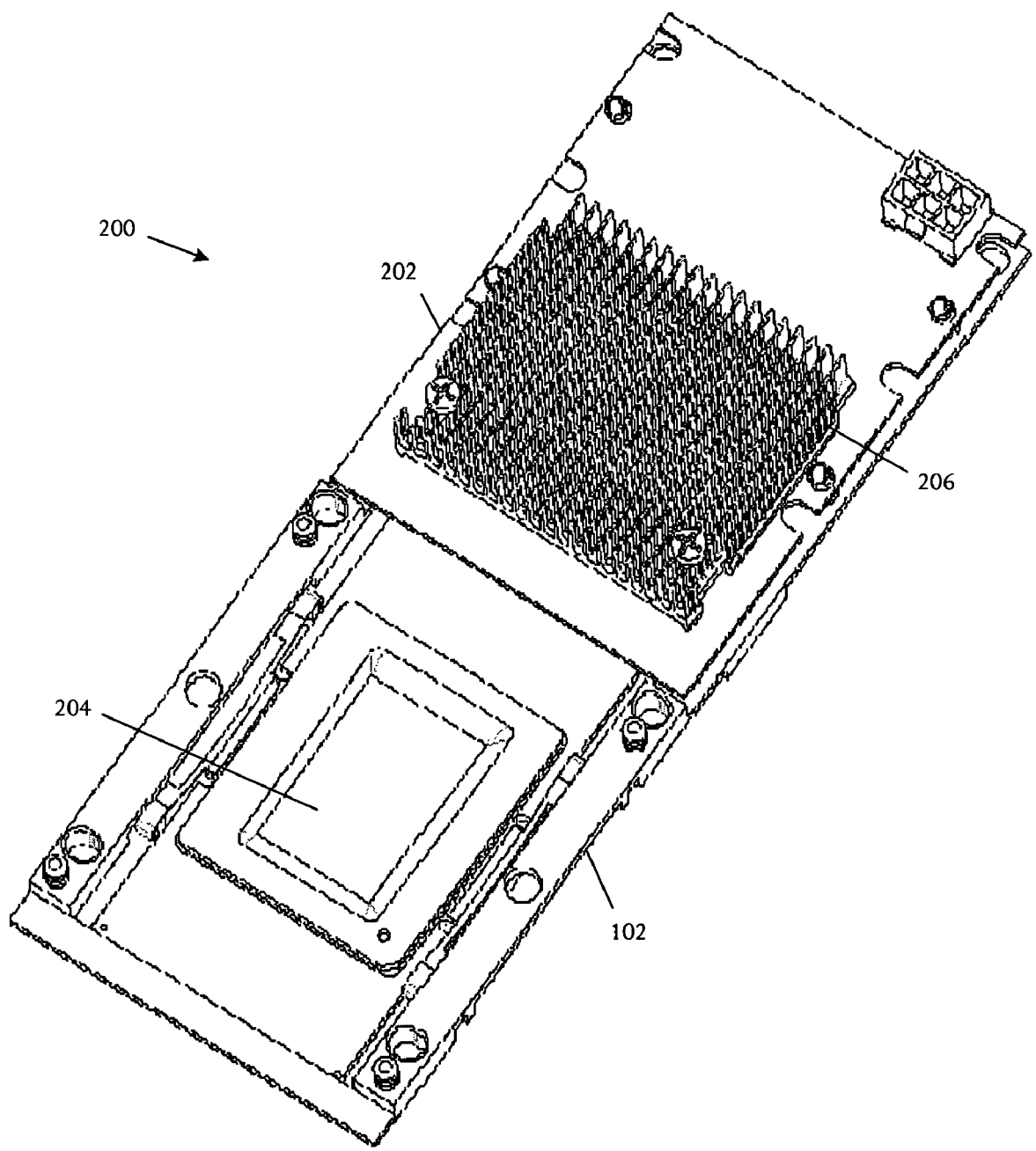
FIGS. 2A and 2B are perspective pictorial diagrams showing embodiments of the assembly with respective connected power pods and processors.
Figure 2B:
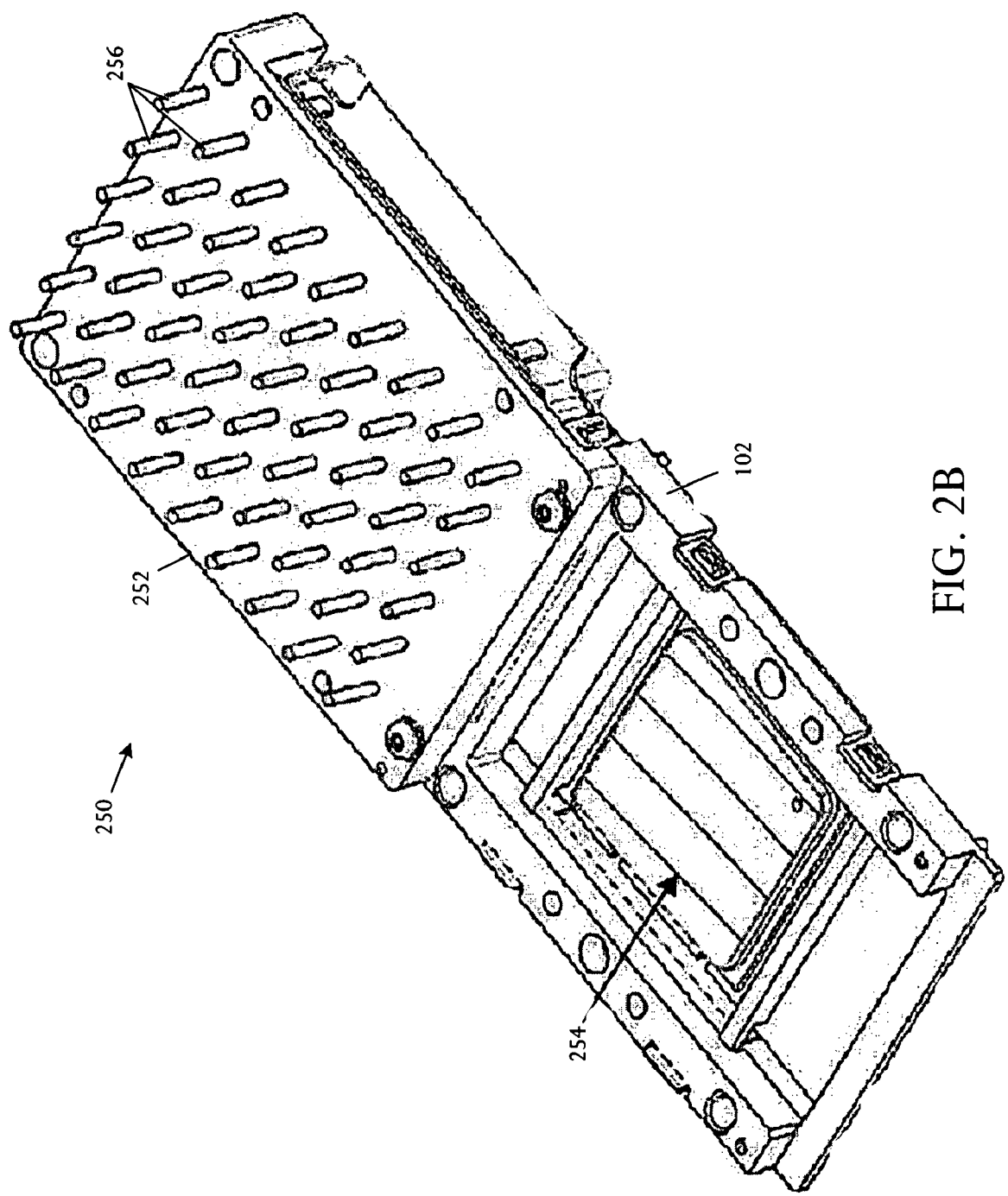

Referring to FIGS. 2A and 2B, perspective pictorial diagrams illustrate embodiments of the assembly 100 with respective connected power pods 202, 252 and processors 204, 254 that can be mounted to the frame 102. The power pod 202 is an example of a heat sink assembly that is adapted to secure to the frame 102. The illustrative heat sink assembly in the form of power pods 202, 252 includes appropriate items, such as screws, barbs or clamps, securing the heat sink assembly to the frame 102. Referring to FIG. 2A, the illustrative the heat sink assembly 202 further comprises a heat sink 206 and a voltage regulator.

The respective power pods 202 and 252 shown in FIGS. 2A and 2B illustratively have two different types of heat sinks 206 and 256. FIG. 2B shows a power pod assembly 252 with a relatively low cooling capability, including a pin fin heat sink 256.

Figure 3A:
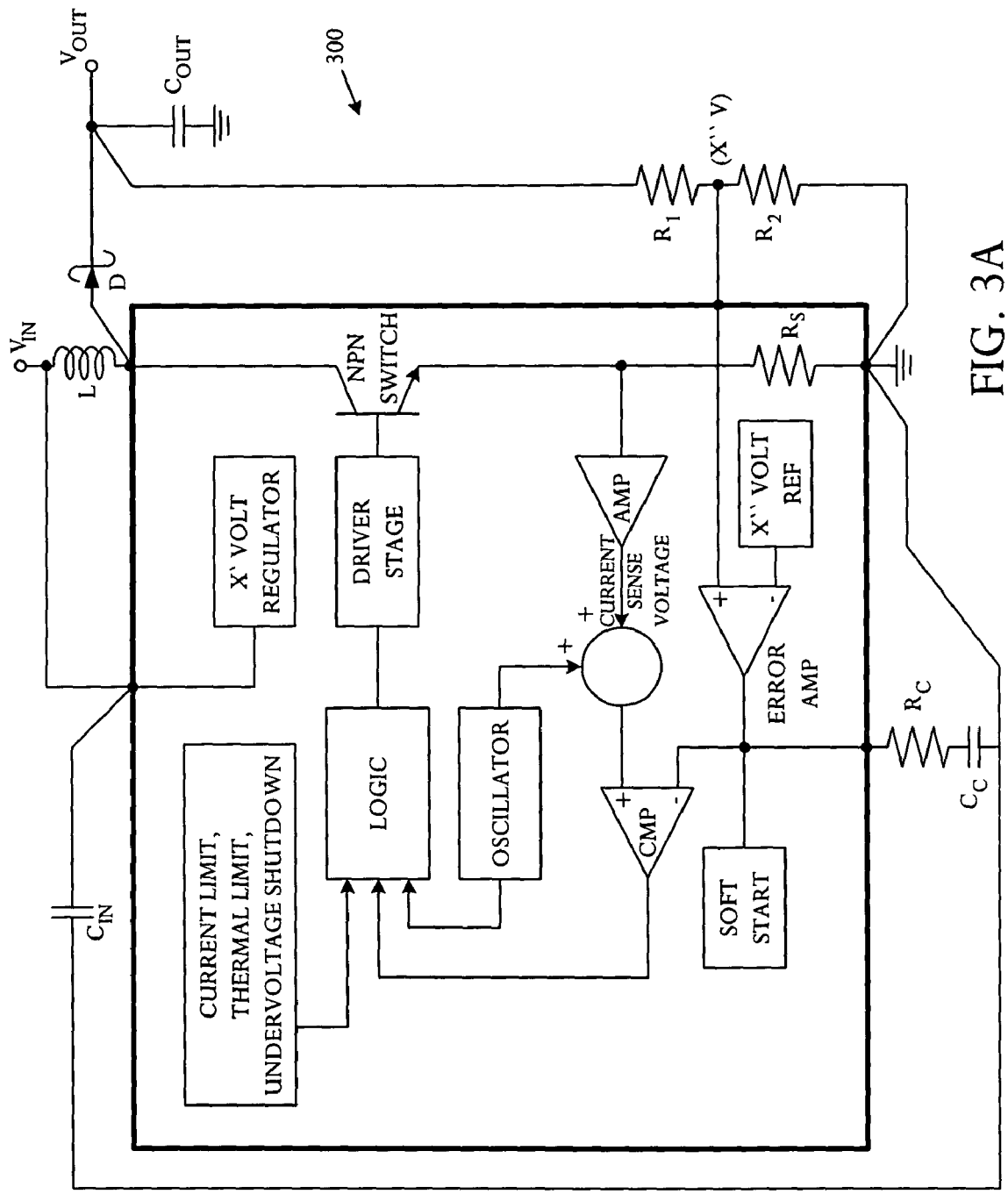
FIGS. 3A and 3B are schematic circuit and block diagrams respectively illustrating embodiments of a voltage regulator circuit and a Y-X voltage converter circuit that may be used in the electronic apparatus and electronic system.
Figure 3B:
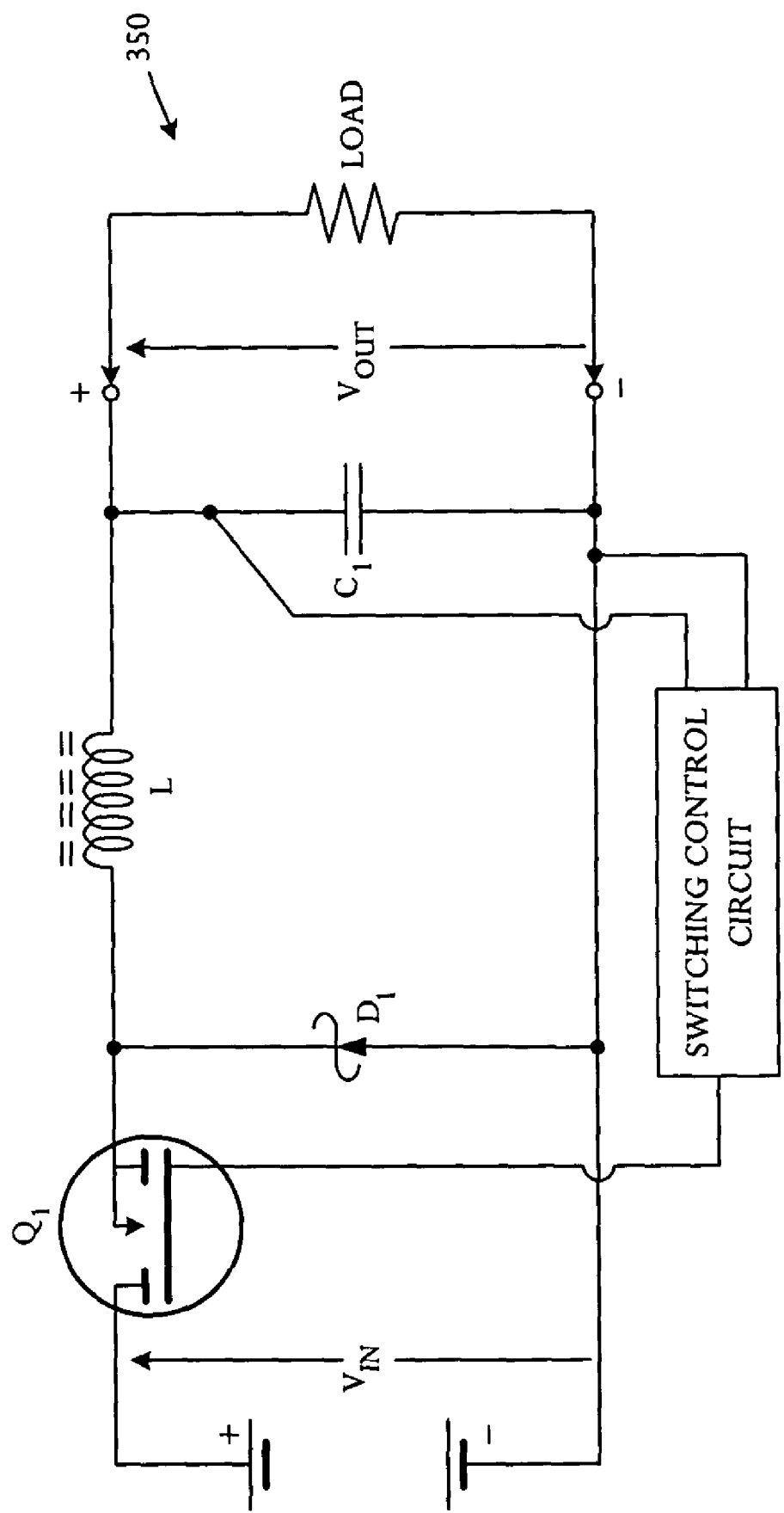

Referring to FIGS. 3A and 3B, schematic circuit and block diagrams respectively illustrate embodiments of a voltage regulator circuit 300 which may be suitable for usage in the assembly 100 shown in FIG. 2.

Although any suitable voltage regulator may be used, FIG. 3A illustrates an example of a regulator circuit. The voltage regulator produces a regulated output voltage at a magnitude dependent on the input voltage and the various components in the circuit. For example, the output voltage may be the same as the input voltage or may be an elevated voltage, if desired. The voltage regulator activates and deactivates the NPN switch at a frequency determined by the oscillator, creating energy in inductor L. When NPN switch is activated, the inductor current charges at a rate of $V_{IN}/L$, storing current in inductor L. When the switch deactivates, the lower end of the inductor L rises to a voltage above $V_{IN}$, discharging current through diode D into output capacitor $C_{OUT}$ at a rate of $(V_{OUT}-V_{IN})/L$. Energy stored in the inductor when the switch is activated is transferred to the output terminal during the switch deactivation time. The output voltage $V_{OUT}$ is controlled by the amount of energy transferred which is controlled by modulating peak inductor current. The modulation takes place by feeding back a portion of the output voltage to an error amplifier which amplifies the difference between the feedback voltage and a reference. Error amplifier output voltage is compared to a voltage proportional to the switch current. The comparator terminates switching when the compared voltages are equal, controlling peak switch current to maintain a constant output voltage.

Referring to FIG. 3B, a schematic mixed circuit and block diagram illustrates an embodiment of a voltage converter circuit 350 that may be suitable for usage in the apparatus 100. The voltage converter circuit is a DC-DC converter used to efficiently convert direct current (DC) electrical power from one voltage level to another. The voltage converter functions by changing input energy into a different impedance level. The illustrative circuit is a Buck type DC-DC converter and includes a switching power metal oxide semiconductor field effect transistor (MOSFET) $Q_1$, a flywheel diode $D_1$, inductor L, and an output filter capacitor $C_1$. A switching control circuit monitors and maintains output voltage $V_{OUT}$ at a predetermined level by switching MOSFET $Q_1$ at the converter's fixed operating frequency, although with a varying duty cycle. When MOSFET $Q_1$ is ON, current begins flowing from an input voltage source $V_{IN}$ through MOSFET $Q_1$ and inductor L, to capacitor $C_1$ and the LOAD. The inductor's magnetic field increases, storing energy in inductor L with the voltage drop across L opposing part of $V_{IN}$. When MOSFET $Q_1$ is OFF, inductor L opposes any reduction in the current by reversing electromagnetic field (EMF) and supplies current to the LOAD via diode $D_1$. The DC output voltage $V_{OUT}$ across the LOAD is a fraction of $V_{IN}$, the fraction being the duty cycle.

Figure 4A:
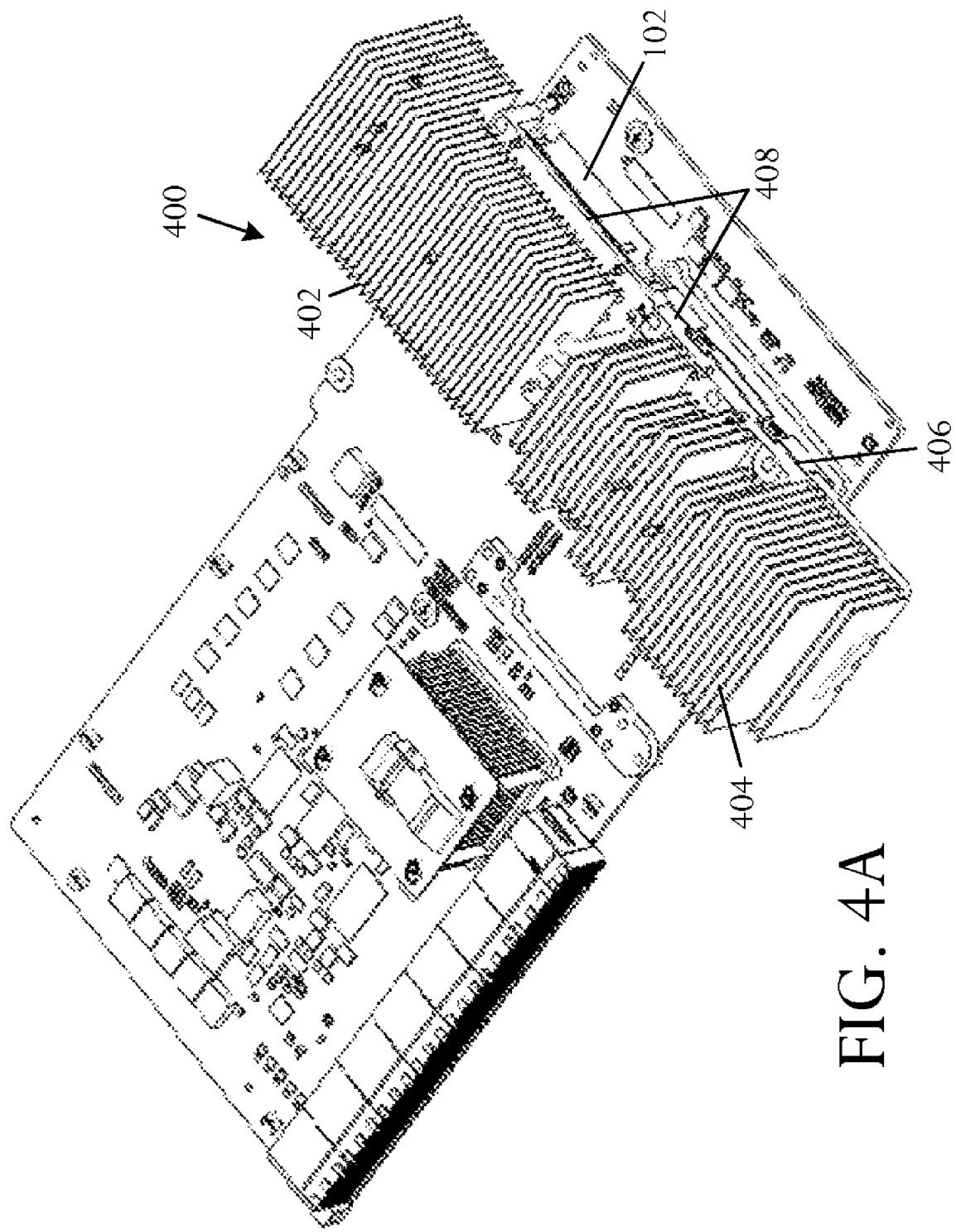
FIGS. 4A and 4B are perspective pictorial diagrams depicting embodiments of heat sink assemblies adapted to secure to an illustrative field replaceable unit.
Figure 4B:
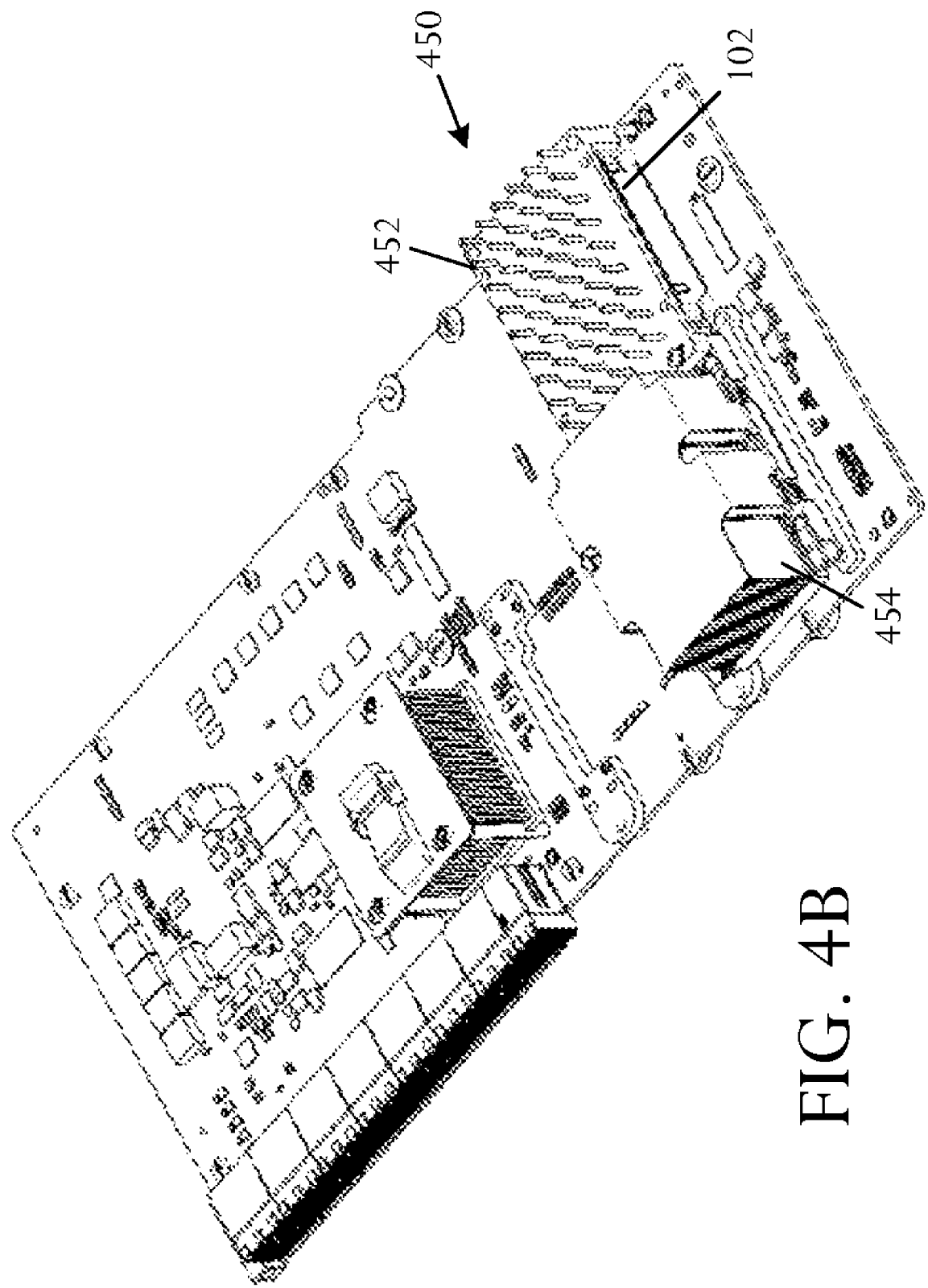

FIGS. 4A and 4B depict various example embodiments of field replaceable units, assembly of field replaceable units into assemblies or boards, and various possible heat sink structures and combinations. Referring to FIG. 4A, a perspective pictorial diagram illustrates an embodiment of a heat sink assembly 400 adapted to secure to the frame 102. The heat sink assembly 400 comprises a voltage regulator, a first heat sink 402 positioned adjacent the voltage regulator. A second heat sink 404 is positioned adjacent the electronic device. The heat sink assembly 400 can be otherwise termed a power pod assembly that is adapted to attach to the frame 102 and processor are packaged in a module 406 with one common surface 408. The first 402 and second 404 heat sinks may have a simple attachment to the module 406 and enable usage of a surface 408 adapted to function as a thermal spreader to spread heat throughout the module 406. In some embodiments, the surface 408 may further include heat pipes that further assist thermal dispersion.

Referring to FIG. 4B, a perspective pictorial diagram depicts another embodiment of a cooling apparatus 450 that includes first 454 and second 452 heat sink assemblies. The first heat sink assembly 454 is configured to secure to the frame 102 and comprises a voltage regulator and a first heat sink 454 positioned adjacent the voltage regulator. The second heat sink assembly 452 is positioned adjacent the electronic device. The first heat sink 454 is used to cool the voltage regulator and has specifications selected appropriately for heat generated by the voltage regulator. The second heat sink 452 is used to cool the electronic device and is specified to suitably address the Heat generated by the electronic device.

Figure 5:
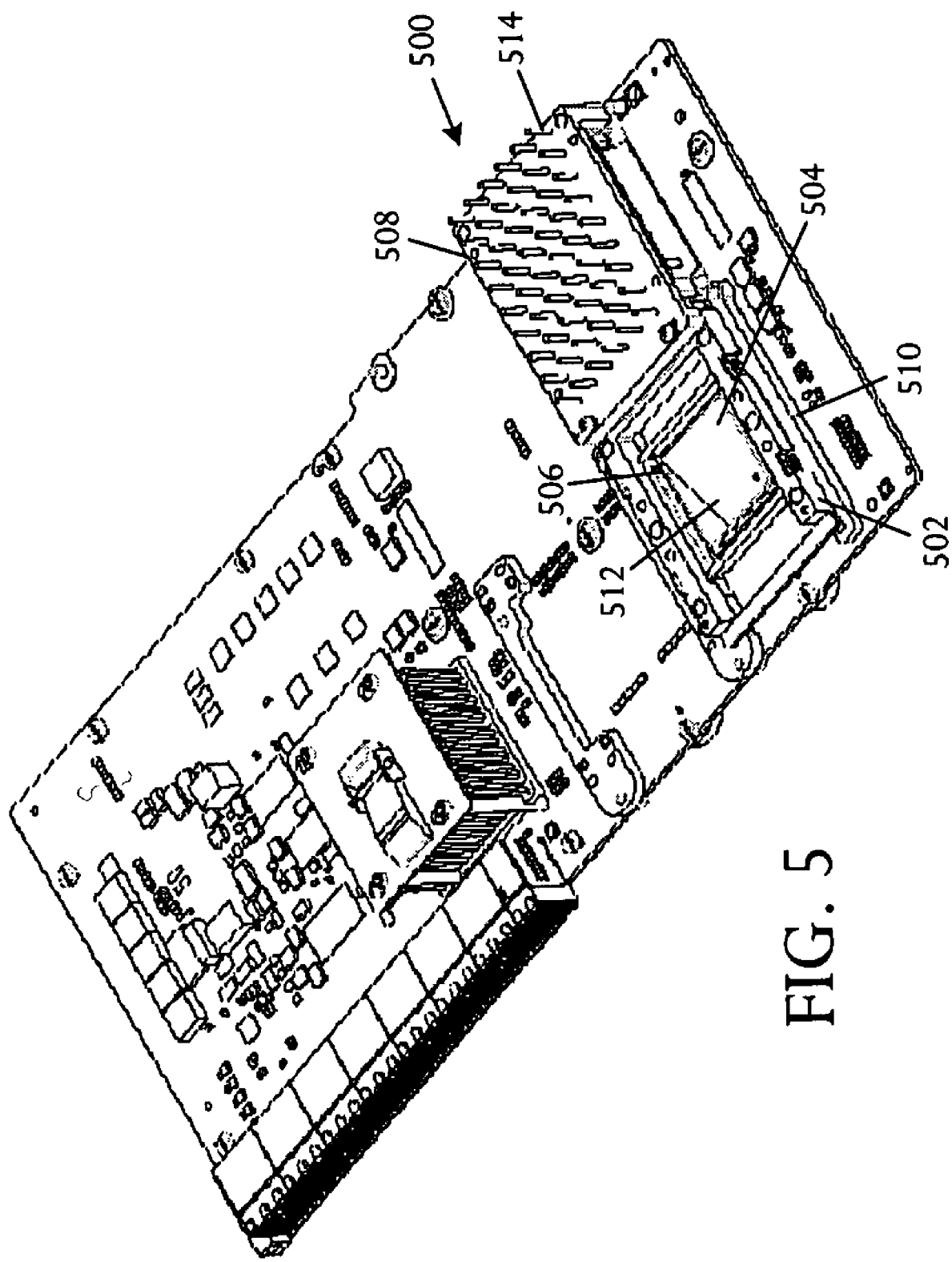
FIG. 5 is a perspective pictorial diagram illustrating an embodiment of an assembly with a field replaceable unit configured to mount an electronic device.

Referring to FIG. 5, a perspective pictorial diagram illustrates an embodiment of an assembly 500 comprising a field replaceable unit 502 that is configured to mount an electronic device 504 having a thickness within a range of thicknesses. One or more springs 506, for example leaf springs or other wire-form, are included with a shape, size, flexibility, strength, and other characteristics selected to secure the electronic device 504 to the field replaceable unit 502. A heat sink assembly 508 is included in the assembly 500 in a configuration that secures to the field replaceable unit 502 after mounting the electronic device 504. In common embodiments, the second heat sink may be larger than the first heat sink, for example to appropriately cool a processor that generates 100-130 watts and a voltage regulator that generates 10-20 watts. The example power ranges are for example only. The illustrative systems, assemblies, devices, and components may have any suitable power specification.

In the illustrative embodiment and many typical configurations, the electronic device 504 is a processor. Processors are typically relatively high power and thus heat generating devices. In other embodiments, the electronic device 504 can be other types of high-power components.

The illustrative field replaceable unit 502 may further comprise a frame 510 with a recess 512 formed on the frame 510 and arranged in a configuration adapted to receive the electronic device 504. Leaf springs are used to attach to the frame 510 adjacent to the recess 512. The electronic device 504 can be attached to the frame 510 by positioning the device 504 on one or more electronic device side supports formed on the frame 510 adjacent the recess 512. For a recess 512 configured in the form of a depression formed into the frame 510, the electronic device side supports may be aligned at right angles to the leaf springs.

The heat sink assembly 508 can further comprise a heat sink 514 positioned near or adjacent to a voltage regulator.

Other embodiments may further include a second heat sink assembly, for example heat sinks 402 and 452 shown respectively in FIGS. 4A and 4B, positioned adjacent the electronic device 504.

The electronic assembly 500 can be constructed by supplying the field replaceable unit 502 which has a structure designed to mount an electronic device 504. Typically, the field replaceable unit structure is formed to enable electronic devices of various thicknesses to be mounted. For example, the electronic devices may be mounted on printed circuit boards of different sizes. In some applications, the structure can be selected to support mounting of different electronic device models, such as multiple various processor models with varying performance specifications. For example, the field replaceable unit 502 includes the frame 510 with a recess 512 having a shape adapted to enable mounting of an electronic device that may be selected from devices of various sizes and/or thicknesses. In some embodiments, device supports may be formed adjacent to the recess 512 to facilitate placement of the electronic device 504.

The electronic device 504 is mounted to the field replaceable unit 502 and secured by application of the leaf springs 506. In an illustrative embodiment, a first edge of the electronic device 504 is set on the device support. A second edge opposite the first edge of the electronic device 504 is clipped into position against the frame 510 using the leaf springs 506.

The heat sink assembly 508 is subsequently fastened to the combination of the field replaceable unit 502 and electronic device 504. In the illustrative structure, the heat sink assembly 508 and the field replaceable unit 502 encase the electronic device 504.

In some embodiments, a first heat sink assembly 508 is fastened to the field replaceable unit 502. The first heat sink assembly 508 comprises a voltage regulator and a first heat sink 514 adjacent to the voltage regulator. A second heat sink assembly 402 or 452 can similarly be fastened to the field replaceable unit 502 in a position adjacent to the electronic device 504.

In some embodiments, the first heat sink assembly 508 may be a power pod assembly. Previous assembly of the power pod assembly 508 to the field replaceable unit 502, before fastening the second heat sink assembly 402 or 452, enables testing of the mounted electronic device or processor without undue difficulty in accessing the device.

The illustrative assembly 500 and construction method enable the heat sinks to be decoupled or separated from electronic devices, such as processors, in a supply chain. Such supply decoupling enables, for example, an expensive processor that is common among multiple platforms or products to be stocked and handled separately from an inexpensive heat sink that may not be common among the various products. Supply chain decoupling assists enabling application of a concept termed postponement—sharing of a common part and customizing the common part later in a supply chain or manufacturing process.

In a particular application, multiple field replaceable units 502 may be stocked with the field replaceable units having installed electronic devices secured by leaf springs. The field replaceable units may be assigned an inventory part number with an assignment made according to item identification of characteristics such as field replaceable unit type and/or model and electronic device type and/or model.

Similarly, multiple heat sink assemblies 508 may be stocked. The heat sink assemblies may be assigned an inventory part number with the assignment made according to item identification of power assembly type and/or model, heat sink type and/or number, and voltage regulator type and/or model.

Figure 6A:
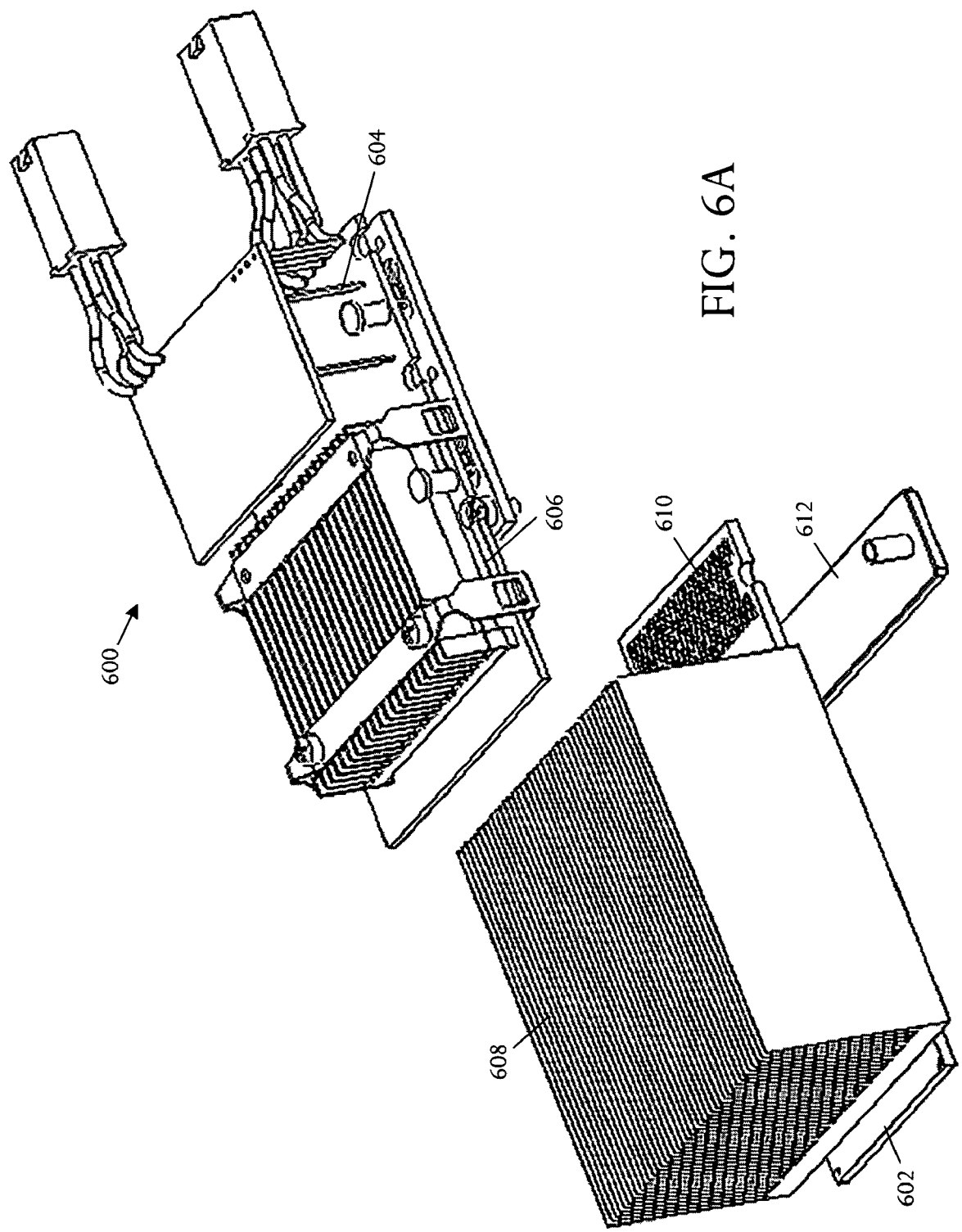
FIGS. 6A and 6B are perspective views showing examples of electronic assemblies and that assemble in a manner different from examples illustrated in FIGS. 1 through 5.
Figure 6B:
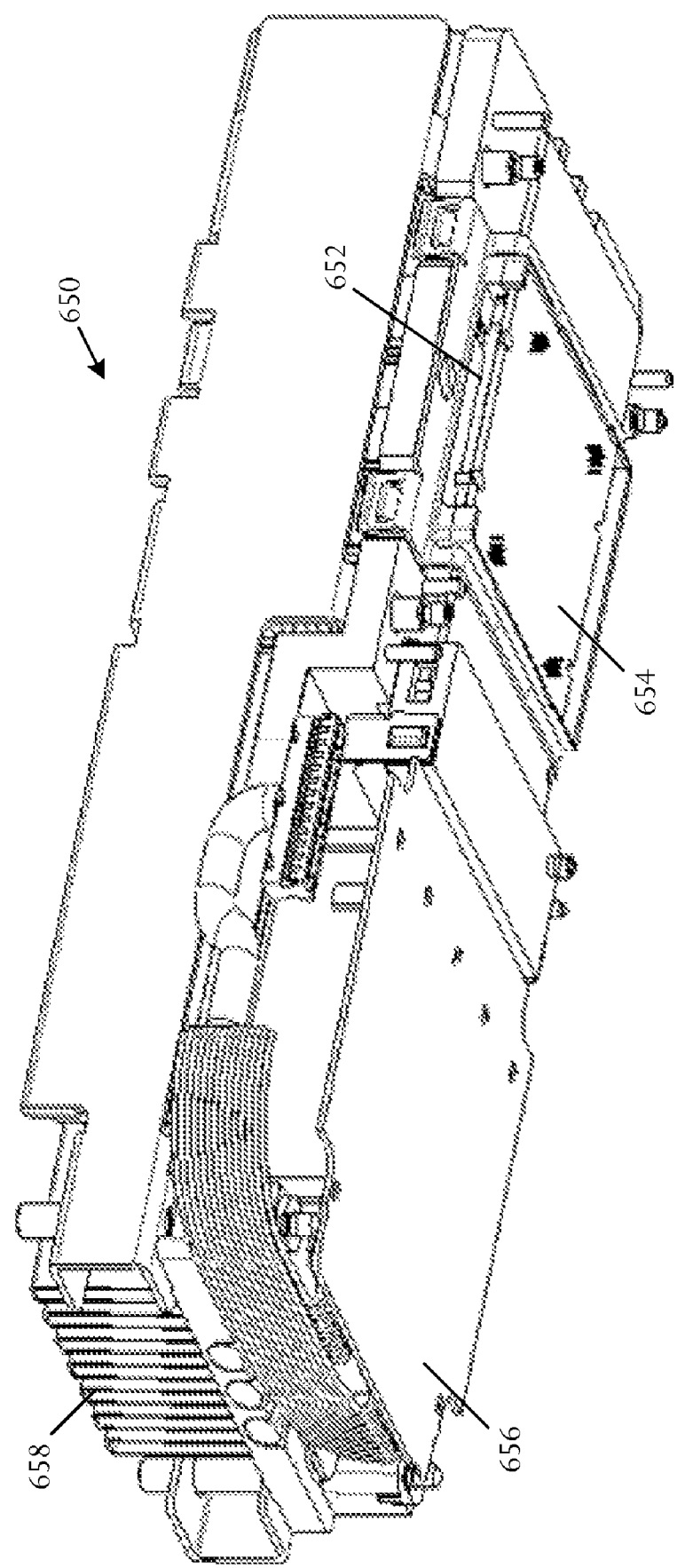

Referring to FIGS. 6A and 6B, two perspective views show examples of electronic assemblies 600 and 650 that assemble in a manner different from that illustrated in FIGS. 1 through 5. FIG. 6A shows an assembly 600 including a separated processor 602, power pod 604 with voltage regulator 606, and heat sink 608. The completely separated assembly 600 assembles inefficiently with multiple process steps. A further problem is that the connection between the power pod 604 or voltage regulator, and the processor 602 is difficult to make with separate pieces once the processor/heat sink is seated in a socket. A connection surface 610 between the voltage regulator 606 and processor 602 is fastened using a bolster plate 612.

FIG. 6B depicts an assembly 650 that is fastened using a clip 652 which holds a processor 654 to an integral assembly of combined components including a voltage regulator 656 and heat sink 658. The combined assembly 650 creates difficulty for multiple products to re-use the same field replaceable unit. Also, the combined structure 650 makes seating of the processor 654 difficult due to the unwieldy extra mass of the heat sink 658.

The assembly 650 includes the spring clip 652 which secures the processor 654 to the heat sink 658. In contrast, the assemblies shown in FIGS. 1 through 5 have a clip that holds the processor to a frame, enabling the processor to be rigidly captured in the frame and forming a durable and rigid overall structure. A heat sink can then be fastened to the frame, forming an overall structure that avoids vibration and damage to the processor.

While the present disclosure describes various embodiments, these embodiments are to be understood as illustrative and do not limit the claim scope. Many variations, modifications, additions and improvements of the described embodiments are possible. For example, those having ordinary skill in the art will readily implement the steps necessary to provide the structures and methods disclosed herein, and will understand that the process parameters, materials, and dimensions are given by way of example only. The parameters, materials, and dimensions can be varied to achieve the desired structure as well as modifications, which are within the scope of the claims. For example, components, assemblies, devices, connectors, and springs with particular structures and geometries are shown. Other examples may have other suitable forms, structures, shapes, and geometries.

In the claims, unless otherwise indicated the article "a" is to refer to "one or more than one".

What is claimed is:

1. An assembly comprising:
   a frame configured to mount an electronic device having a thickness within a range of thicknesses and to be assembled to a heat sink assembly with the electronic device sandwiched between a portion of the frame and the heat sink assembly; and
   at least one spring engaging the frame and configured to secure the electronic device to the frame with the electronic device sandwiched between the portion of the frame and the heat sink assembly and to resiliently urge the electronic device in a direction away from the heat sink assembly.

2. The assembly according to claim 1 further comprising:
   a field replaceable unit comprising the frame and the at least one spring.

3. The assembly according to claim 1 further comprising:
   a recess formed on the frame and adapted to receive the electronic device.

4. The assembly according to claim 1 further comprising:
   a recess formed on the frame and adapted to receive the electronic device; and
   at least one electronic device side support coupled to the frame adjacent the recess, the at least one electronic device side support being arranged substantially orthogonal to the at least one spring.

5. The assembly according to claim 1 further comprising:
   a bolster plate integrated to the frame.

6. The assembly according to claim 1 further comprising:
   the heat sink assembly fastened to the frame and securing the electronic device encased within the frame and the heat sink assembly, the heat sink assembly further comprising:
   a heat sink; and
   a voltage regulator.

7. The assembly according to claim 1 further comprising:
   the heat sink assembly secured to the frame and comprising:
   a voltage regulator;
   a first heat sink positioned adjacent the voltage regulator; and
   a second heat sink positioned adjacent the electronic device.

8. The assembly according to claim 1 further comprising:
   the electronic device comprising a processor mounted to the frame.

9. The assembly according to claim 1 wherein:
   the at least one spring is at least one leaf spring.

10. The assembly of claim 1, wherein the least one spring is configured to be sandwiched between the electronic device and the heat sink assembly.

11. An assembly comprising:
    a field replaceable unit configured to mount an electronic device having a thickness within a range of thicknesses;
    at least one spring adapted to secure the electronic device to the field replaceable unit; and
    a heat sink assembly configured to be secured to the field replaceable unit over the field replaceable unit with the at least one spring sandwiched between the heat sink assembly and the field replaceable unit.

12. The assembly according to claim 11 wherein the field replaceable unit further comprises:
    a frame;
    a recess formed on the frame and adapted to receive the electronic device between the frame and the heat sink assembly;
    the at least one spring engaging the frame adjacent to the recess and configured to urge the electronic device in a direction perpendicular to the electronic device away from the heat sink assembly; and
    at least one electronic device side support coupled to the frame adjacent the recess, the at least one electronic device side support being arranged substantially orthogonal to the at least one spring.

13. The assembly according to claim 12 further comprising:
    a bolster plate integrated to the frame.

14. The assembly according to claim 11 wherein the heat sink assembly further comprises:
    a heat sink; and
    a voltage regulator.

15. The assembly according to claim 11, wherein the heat sink assembly comprises
    a voltage regulator;
    a first heat sink positioned adjacent the voltage regulator; and
    a second heat sink positioned adjacent the electronic device.

16. The assembly according to claim 11 wherein:
the electronic device is a processor.

17. The assembly according to claim 11 wherein:
the at least one spring is at least one leaf spring.

18. A method of constructing an electronic assembly comprising:
proventia a field replaceable unit adapted to mount to an electronic device;
mounting the electronic device to the field replaceable unit;
securing the electronic device to the field replaceable unit using a spring; and
fastening a heat sink assembly to the field replaceable unit wherein the electronic device is encased between the field replaceable unit and the heat sink assembly such that the spring is sandwiched between the heat sink assembly and the electronic device and urges the electronic device in a direction away from the heat sink assembly.

19. The method according to claim 18 further comprising:
providing the field replaceable unit that mounts an electronic device having a thickness within a range of thicknesses.

20. The method according to claim 18, wherein the field replaceable unit includes
a frame, a recess in the frame adapted to mount the electronic device, and a device support adjacent the recess and wherein the method further comprises:
setting a first edge of the electronic device on the device support; and
attaching a second edge opposite the first edge of the electronic device in position against the frame using the spring.

21. The method according to claim 18, wherein the field replaceable unit and the electronic device mounted to the field replaceable unit form a loaded field replaceable unit , the method further comprising:
stocking a plurality of loaded field replaceable units; and
assigning an inventory part number to each of the stocked loaded field replaceable units, the inventory part number being assigned according to item identification of field replaceable unit type and/or model, and electronic device type and/or model.

22. The method according to claim 18 further comprising:
stocking a plurality of the heat sink assemblies; and
assigning an inventory part number to the stocked heat sink assembly plurality, the inventory part number being assigned according to item identification of power assembly type and/or model, heat sink type and/or number, and voltage regulator type and/or model.

23. The method according to claim 18, wherein the heat sink assembly comprises a voltage regulator and a heat sink adjacent to the voltage regulator; and wherein the method further comprises fastening a second heat sink to the field replaceable unit adjacent to the electronic device.

24. The method according to claim 18 wherein:
the at least one spring is at least one leaf spring.

25. The assembly according to claim 1 further comprising:
the heat sink assembly fastened to the frame and securing the electronic device encased within the frame and the heat sink assembly.

26. An assembly comprising:
a frame configured to mount an electronic device having a thickness within a range of thicknesses and to be assembled to a heat sink assembly with the electronic device sandwiched between a portion of the frame and the heat sink assembly; and
at least one spring engaging the frame and configured to secure the electronic device to the frame with the electronic device sandwiched between the portion of the frame and the heat sink assembly; and
the heat sink assembly secured to the frame and comprising:
a voltage regulator;
a first heat sink positioned adjacent the voltage regulator; and
a second heat sink positioned adjacent the electronic device.

* * * * *

UNITED STATES PATENT AND TRADEMARK OFFICE
CERTIFICATE OF CORRECTION

| | | |
|---|---|---|
| PATENT NO. | : 7,859,847 B2 | Page 1 of 1 |
| APPLICATION NO. | : 11/027337 | |
| DATED | : December 28, 2010 | |
| INVENTOR(S) | : Stephan Karl Barsun | |

It is certified that error appears in the above-identified patent and that said Letters Patent is hereby corrected as shown below:

In column 8, line 26, in Claim 10, delete "the least one" and insert -- the at least one --, therefor.

In column 10, line 12, in Claim 23, delete "a heat" and insert -- a first heat --, therefor.

Signed and Sealed this
Thirty-first Day of July, 2012

David J. Kappos
*Director of the United States Patent and Trademark Office*